(12) United States Patent
Yamazaki et al.

(10) Patent No.: US 8,349,079 B2
(45) Date of Patent: Jan. 8, 2013

(54) APPARATUS FOR MANUFACTURING GROUP III NITRIDE SEMICONDUCTOR

(75) Inventors: Shiro Yamazaki, Aichi-ken (JP); Koji Hirata, Aichi-ken (JP)

(73) Assignee: Toyoda Gosei Co., Ltd., Nishikasugai-Gun, Aichi-Ken (JP)

( * ) Notice: Subject to any disclaimer, the term of this patent is extended or adjusted under 35 U.S.C. 154(b) by 1258 days.

(21) Appl. No.: 12/153,973

(22) Filed: May 28, 2008

(65) Prior Publication Data
US 2008/0299020 A1    Dec. 4, 2008

(30) Foreign Application Priority Data

May 30, 2007    (JP) ................................. 2007-144219

(51) Int. Cl.
*C30B 35/00*    (2006.01)
*C30B 11/00*    (2006.01)
(52) U.S. Cl. ....................................... 117/206; 117/200
(58) Field of Classification Search ................... 117/206, 117/200
See application file for complete search history.

(56) References Cited

U.S. PATENT DOCUMENTS

| | | | |
|---|---|---|---|
| 7,381,268 B2 * | 6/2008 | Minemoto et al. | 117/216 |
| 7,754,012 B2 * | 7/2010 | Minemoto et al. | 117/89 |
| 2007/0157876 A1 * | 7/2007 | Minemoto et al. | 117/109 |

FOREIGN PATENT DOCUMENTS

| | | |
|---|---|---|
| JP | 1-241113 A | 9/1989 |
| JP | 2001-58900 | 3/2001 |
| JP | 2003-286099 | 10/2003 |
| WO | WO 2005/103341 A1 | 11/2005 |

OTHER PUBLICATIONS

Japanese Office Action dated Feb. 8, 2011, with partial English translation.

* cited by examiner

*Primary Examiner* — James McDonough
(74) *Attorney, Agent, or Firm* — McGinn IP Law Group, PLLC

(57) ABSTRACT

An apparatus for manufacturing a Group III nitride semiconductor is composed of a pressure vessel, a reaction vessel disposed within the pressure vessel, a heating device disposed within the pressure vessel so as to heat the reaction vessel, and a glove box filled with argon gas. The pressure vessel and the glove box are connected to each other via a gate valve. By virtue of this configuration, a large-sized reusable reaction vessel can be disposed within the pressure vessel without causing oxidation of Na.

19 Claims, 6 Drawing Sheets

APPARATUS FOR MANUFACTURING GROUP III NITRIDE SEMICONDUCTOR

BACKGROUND OF THE INVENTION

1. Field of the Invention

The present invention relates to an apparatus for manufacturing a Group III nitride semiconductor, and particularly to an apparatus for manufacturing a Group III nitride semiconductor according to an Na flux method.

2. Description of the Related Art

Conventionally, an Na flux method for growing a Group III nitride semiconductor crystal is known. According to the Na flux method, sodium (Na) and gallium (Ga) are melted, and a resultant mixed melt is maintained at a temperature of about 800° C. The mixed melt is subjected to reaction with nitrogen under a high pressure of about 100 atmospheres, thereby growing a gallium nitride (GaN) crystal on the surface of a seed crystal.

In order to yield GaN having a low impurity content by the Na flux method, high-purity Na is required. Since Na is highly reactive and highly susceptible to oxidization, weighing and like work are carried out within a glove box filled with an inert gas, such as argon gas. According to a work procedure shown in Japanese Patent Application Laid-Open (kokai) No. 2003-286099, a reaction vessel, which holds a mixed melt of Na and Ga, is separated from an apparatus for manufacturing a Group III nitride semiconductor and is placed in a glove box so as to undergo necessary work. Within the glove box, Ga and Na are placed in a crucible; the crucible is placed in the reaction vessel; and the reaction vessel is closed so as to be sealed from the external atmosphere. Subsequently, the reaction vessel is removed from inside the glove box and is then attached to the manufacturing apparatus.

Japanese Patent Application Laid-Open (kokai) No. 2001-58900 discloses an apparatus for manufacturing a Group III nitride semiconductor according to an Na flux method. The manufacturing apparatus assumes the form of a dual vessel in which a reaction vessel is disposed within a pressure vessel. Such a configuration eliminates the need to employ a reaction vessel having a high withstand pressure, so that costs can be curbed.

In the case where a small-sized reaction vessel is used, a disposable reaction vessel made of stainless steel (SUS) has been used in work as described in Japanese Patent Application Laid-Open (kokai) No. 2003-286099. The disposable type is employed for the need to completely seal the reaction vessel. In the case where a large-sized reaction vessel is used, since such a large-sized reaction vessel made of SUS is expensive, the reaction vessel is required to be reusable. However, since such a reusable reaction vessel cannot be completely sealed, the method of Japanese Patent Application Laid-Open (kokai) No. 2003-286099 involves a drawback in that Na is oxidized before the reaction vessel removed from inside the glove box is attached to the manufacturing apparatus.

It is also possible to dispose the entire manufacturing apparatus within a glove box. However, since a manufacturing apparatus in the form of a dual vessel in which a reaction vessel is disposed within a pressure vessel is large in size, the glove box must be of a large size. This is not economical.

SUMMARY OF THE INVENTION

An object of the present invention is to provide an apparatus for manufacturing a Group III nitride semiconductor which uses a dual vessel configured to have a reaction vessel within a pressure vessel and in which the reaction vessel can be disposed within the pressure vessel in such a manner that Na is not oxidized.

In order to solve the aforementioned problems, the following means are effective.

As a first means, the present invention provides an apparatus for manufacturing a Group III nitride semiconductor comprising a reaction vessel which holds, in a molten state, a Group III metal and a metal different from the Group III metal and serving as flux; a heating device for heating the reaction vessel; and a pressure vessel which contains the reaction vessel and the heating device. The apparatus further comprises a glove box filled with a gas which does not react with the flux. In the apparatus, the pressure vessel and the glove box are connected to each other.

As a second means, the present invention provides an apparatus for manufacturing a Group III nitride semiconductor according to the first means, wherein the pressure vessel and the glove box are connected to each other via a gate valve or a door.

As a third means, the present invention provides an apparatus for manufacturing a Group III nitride semiconductor comprising a reaction vessel which holds, in a molten state, a Group III metal and a metal different from the Group III metal and serving as flux; a heating device for heating the reaction vessel; and a pressure vessel which contains the reaction vessel and the heating device. The apparatus further comprises a glove box filled with a gas which does not react with the flux. In the apparatus, the pressure vessel has an opening-closing portion which is opened and closed by means of a lid, and the pressure vessel and the glove box are connected to each other such that the lid and the opening-closing portion are located within the glove box.

In the first and third means, the flux may be sodium or potassium and may contain, for example, an alkaline-earth metal, such as calcium, or lithium. A gas which does not react with the flux is, for example, an inert gas, such as argon gas.

As a fourth means, the present invention provides an apparatus for manufacturing a Group III nitride semiconductor according to the third means, further comprising a moving device for relatively transferring the reaction vessel from the interior of the glove box to the interior of the pressure vessel, wherein the reaction vessel is connected to a side of the lid, which side is located toward the pressure vessel. The reaction vessel and the lid are not necessarily connected directly to each other. For example, the reaction vessel and the lid may be connected to each other via piping for supplying nitrogen to the reaction vessel. In the moving device the reaction vessel with the lid may be moved. Alternatively only the pressure vessel may be moved and also the pressure vessel and the glove box may be moved together.

As a fifth means, the present invention provides an apparatus for manufacturing a Group III nitride semiconductor according to the fourth means, wherein the pressure vessel and the glove box are fixed together; the moving device is connected to the reaction vessel; and the moving device moves the reaction vessel, thereby transferring the reaction vessel from the interior of the glove box to the interior of the pressure vessel.

As a sixth means, the present invention provides an apparatus for manufacturing a Group III nitride semiconductor according to the fourth means, wherein the reaction vessel and the lid are fixed together; the moving device is connected to the glove box or the pressure vessel; and the moving device relatively moves the pressure vessel or the pressure vessel with the glove box to the reaction vessel and the lid, thereby transferring the reaction vessel from the interior of the glove box to the interior of the pressure vessel.

As a seventh means, the present invention provides an apparatus for manufacturing a Group III nitride semiconductor according to the fourth means, wherein the reaction vessel and the glove box are fixed together; the pressure vessel and the glove box are connected to each other in such a manner that the opening-closing portion of the pressure vessel can move within the glove box; the moving device is connected to the pressure vessel; and the moving device moves the pressure vessel, thereby transferring the reaction vessel from the interior of the glove box to the interior of the pressure vessel.

As an eighth means, the present invention provides an apparatus for manufacturing a Group III nitride semiconductor according to any one of the third means to the seventh means, wherein the pressure vessel is connected horizontally to the glove box.

As a ninth means, the present invention provides an apparatus for manufacturing a Group III nitride semiconductor according to any one of the third means to the seventh means, wherein the pressure vessel is connected vertically to the glove box.

As a tenth means, the present invention provides an apparatus for manufacturing a Group III nitride semiconductor according to any one of the first means to the ninth means, wherein the reaction vessel and the heating device are enclosed by a thermal insulator.

As an eleventh means, the present invention provides an apparatus for manufacturing a Group III nitride semiconductor according to any one of the first means to the tenth means, wherein the Group III metal is gallium, and the metal different from the Group III metal is sodium.

According to the apparatus for manufacturing a Group III nitride semiconductor of the present invention, since the glove box and the pressure vessel can maintain the same internal atmosphere, after weighing within the glove box, the reaction vessel can be disposed in the pressure vessel without involvement of oxidation of flux or a like problem. This eliminates the need to completely seal the reaction vessel and allows use of a large-sized reusable reaction vessel. As a result, the apparatus for manufacturing a Group III nitride semiconductor of the present invention enables low-cost manufacture of a large-sized Group III nitride semiconductor of high quality. Also, a small-sized glove box can be used. Furthermore, the structure in which the reaction vessel is disposed within the pressure vessel eliminates the need to use a reaction vessel having high withstand pressure and allows use of a low-cost reaction vessel.

The present invention can be applied to the manufacture of a Group III nitride semiconductor according to an Na flux method. A Group III nitride semiconductor can be used to fabricate a semiconductor device, such as an LED.

DESCRIPTION OF THE PREFERRED EMBODIMENTS

Embodiments of the present invention will next be described with reference to the drawings. However, the present invention is not limited to the embodiments.

Embodiment 1

Figure 1:
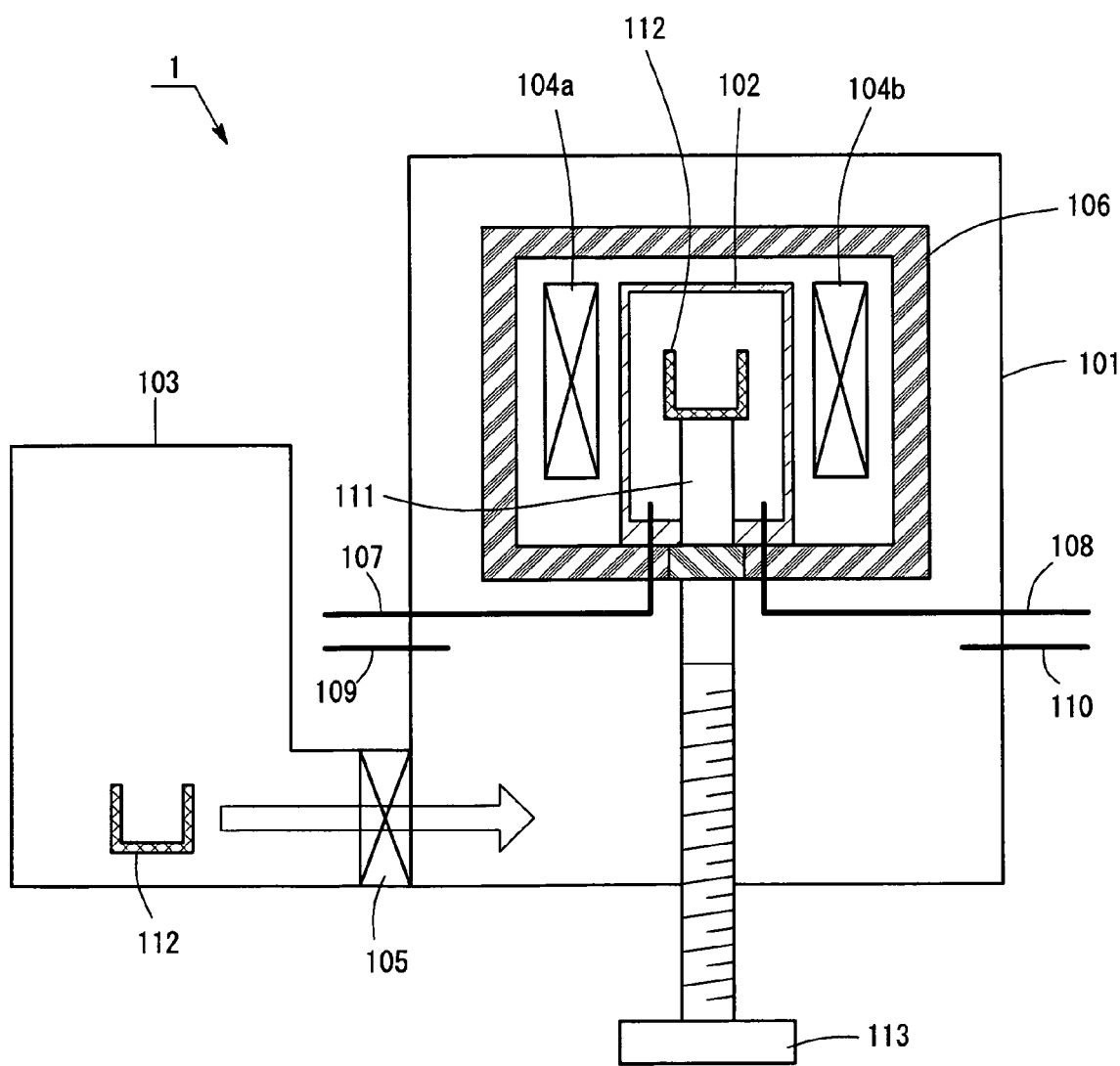
FIG. 1 is a sectional view showing the configuration of a Group-III-nitride-semiconductor manufacturing apparatus according to Embodiment 1 of the present invention.

FIG. 1 schematically shows the configuration of a Group-III-nitride-semiconductor manufacturing apparatus 1 according to Embodiment 1 of the present invention. The Group-III-nitride-semiconductor manufacturing apparatus 1 is used to manufacture a Group III nitride semiconductor according to a flux method. The configuration of the Group-III-nitride-semiconductor manufacturing apparatus 1 is described below.

The Group-III-nitride-semiconductor manufacturing apparatus 1 includes a pressure vessel 101; a reaction vessel 102 disposed within the pressure vessel 101; heating devices 104a and 104b disposed within the pressure vessel 101 and adapted to heat the reaction vessel 102; and a glove box 103 filled with argon gas. The pressure vessel 101 and the glove box 103 are connected to each other via a gate valve 105 which can be opened and closed. When the gate valve 105 is opened, the pressure vessel 101 and the glove box 103 can have the same internal atmosphere. The heating devices 104a and 104b use a heater material of Fe—Al—Cr, Ta, Mo, W, W—Re, or the like.

A thermal insulator 106 is disposed within the pressure vessel 101 in such a manner as to enclose the reaction vessel 102 and the heating devices 104a and 104b. The thermal insulator 106 enables efficient heating of the reaction vessel 102 and eliminates need for the pressure vessel 101 to have high thermal-resistance. Connected to the reaction vessel 102 are a supply pipe 107 for supplying nitrogen into the reaction vessel 102, and an exhaust pipe 108 for exhausting the reaction vessel 102. Similarly, connected to the pressure vessel 101 are a supply pipe 109 and an exhaust pipe 110 for exhausting the pressure vessel 101. The supply pipes 107 and 109 are connected to an unillustrated source cylinder.

A columnar, movable tray 111 is disposed within the pressure vessel 101. Disposed on the movable tray 111 is a crucible 112 which contains a mixed melt of Ga, and Na serving as flux, and a seed crystal. A lower portion of the movable tray 111 has a screw-like spiral structure, and a moving member 113 can move the movable tray 111 upward and downward. The movable tray 111 rises and seals the reaction vessel 102.

Next, the structures of the reaction vessel 102 and the movable tray 111 will be described in detail.

Figure 2:
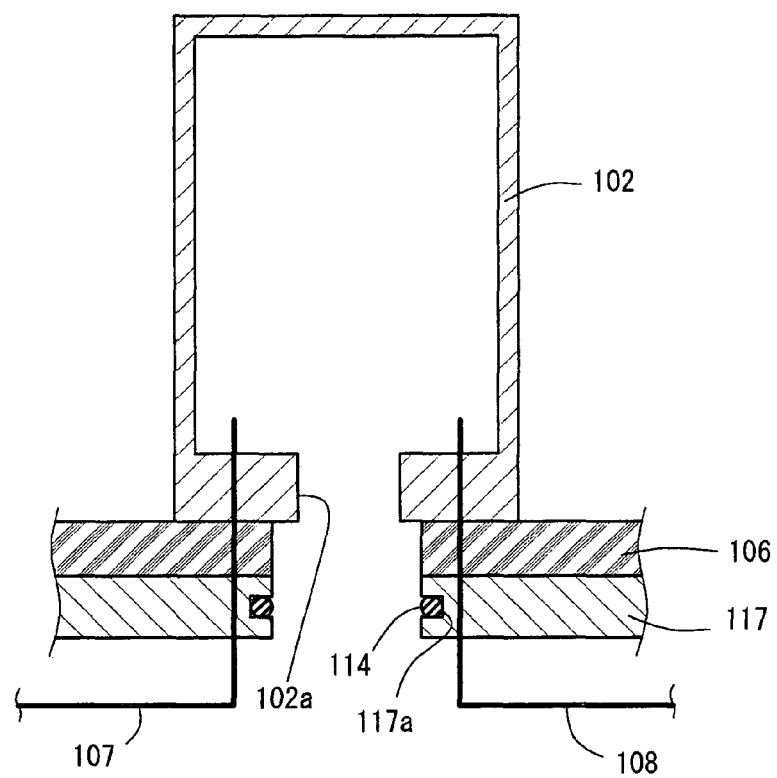
FIG. 2 is a view showing the structure of a reaction vessel of the apparatus of FIG. 1.
Figure 3:
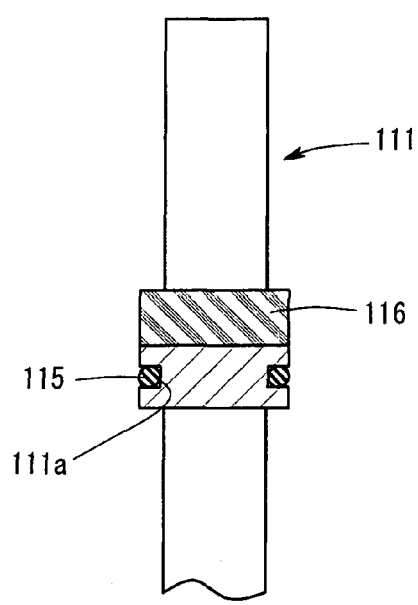
FIG. 3 is a view showing the structure of a movable tray of the apparatus of FIG. 1.
Figure 4:
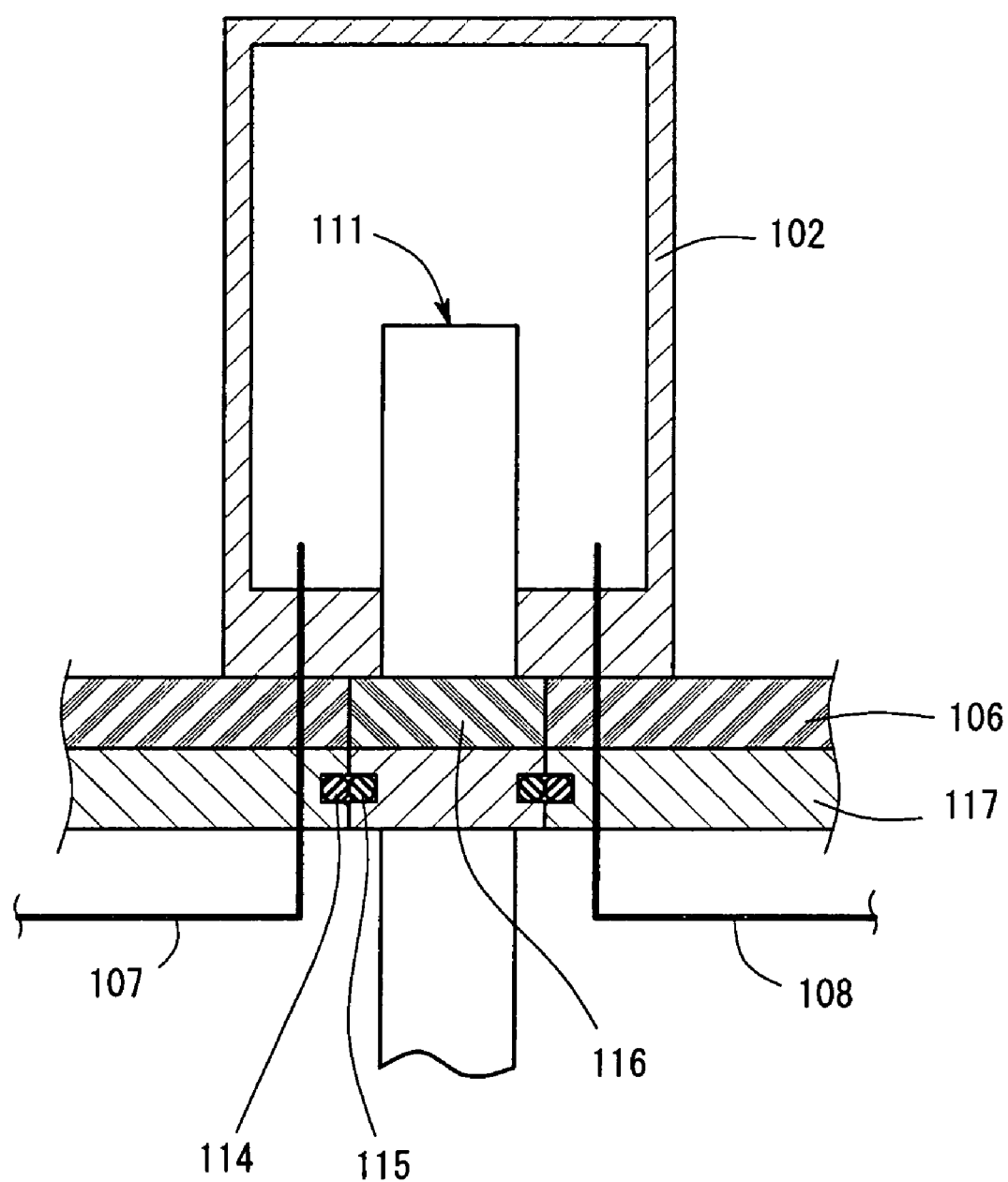
FIG. 4 is a view showing a state in which the reaction vessel of FIG. 2 is sealed by the movable tray of FIG. 3.

FIG. 2 shows the structure of the reaction vessel 102 in detail. The reaction vessel 102 has a circular opening portion 102a at the bottom thereof. The thermal insulator 106 and a base 117 for the thermal insulator 106 do not cover the opening portion 102a. An annular groove 117a is provided on the wall of a hole formed in the base 117 at a position corresponding to the opening portion 102a. An O-ring 114 is fitted into the groove 117a. FIG. 3 shows the structure of the movable tray 111 in detail. The movable tray 111 has an annular groove 111a provided on its upper side wall. An O-ring 115 is fitted into the groove 111a. A portion of the movable tray 111 which is located above the groove 111a is formed of a thermal insulator 116. FIG. 4 shows a state in which the movable tray 111 is raised and seals the reaction vessel 102. The reaction vessel 102 is sealed by means of the two O-rings 114 and 115 located under the opening portion 102a, so that the interior of the reaction vessel 102 is shut off from the interior of the pressure vessel 101. The thermal insulator 116 prevents heat in the reaction vessel 102 from conducting to the exterior of the reaction vessel 102 via the movable tray 111.

Next will be described a process for manufacturing GaN by the Group-III-nitride-semiconductor manufacturing apparatus 1, and the operation of the Group-III-nitride-semiconductor manufacturing apparatus 1.

First, in the glove box 103, weighing is carried out to prepare gallium (Ga), sodium (Na) serving as a flux material, and a seed crystal in respectively predetermined amounts, and the thus-prepared substances are placed in the crucible 112. The pressure vessel 101 is previously supplied with argon gas through the supply pipe 109 and is filled with argon gas. Then, the gate valve 105 is opened, and the crucible 112 is placed on the movable tray 111. By this procedure, the crucible 112 can be transferred from the glove box 103 into the pressure vessel 101 without involvement of oxidation of Na contained in the crucible 112 or a like problem.

In the above-mentioned process, the crucible 112 is placed on the movable tray 111. According to an acceptable alternative process, after the crucible 112 is placed in the reaction vessel 102 disposed within the glove box 103, the reaction vessel 102 is placed on the movable tray 111. The pressure vessel 101 and the glove box 103 are connected to each other via the gate valve 105; however, the gate valve 105 may be replaced with a door.

Next, the movable tray 111 is raised to bring the crucible 112 into the reaction vessel 102 and to seal the reaction vessel 102 by the movable tray 111; the gate valve 105 is closed; and the pressure vessel 101 is evacuated to a vacuum. Then, nitrogen is supplied into the reaction vessel 102 and the pressure vessel 101 through the supply pipes 107 and 109, respectively, thereby pressurizing the reaction vessel 102 and the pressure vessel 101. At this time, desirably, the pressure in the reaction vessel 102 is slightly higher than that in the pressure vessel 101. This prevents entry of impurities into the reaction vessel 102 from the pressure vessel 101.

Next, the reaction vessel 102 is heated, by the heating devices 104a and 104b, to a temperature at which a GaN crystal grows, thereby initiating crystal growth. Since the movable tray 111 has a function of thermal insulation, there is restrained thermal conduction from the reaction vessel 102 to the pressure vessel 101 via the movable tray 111.

After completion of crystal growth, the crucible 112 is transferred into the glove box 103 through the reverse procedure of the above-mentioned procedure.

The configuration of the Group-III-nitride-semiconductor manufacturing apparatus 1 enables placement of the crucible 112 in the reaction vessel 102 without involvement of oxidation of Na or a like problem, thereby eliminating the need to completely seal the reaction vessel 102 and thus enabling use of a large-sized reusable reaction vessel as the reaction vessel 102. As a result, a large-sized Group III nitride semiconductor of high quality can be manufactured, and manufacturing costs can be curbed. Also, the size of the glove box 103 can be reduced. Furthermore, the structure in which the reaction vessel 102 is disposed within the pressure vessel 101 eliminates need for the reaction vessel 102 to have high withstand pressure, so that costs for the reaction vessel 102 can be curbed.

Embodiment 2

Figure 5:
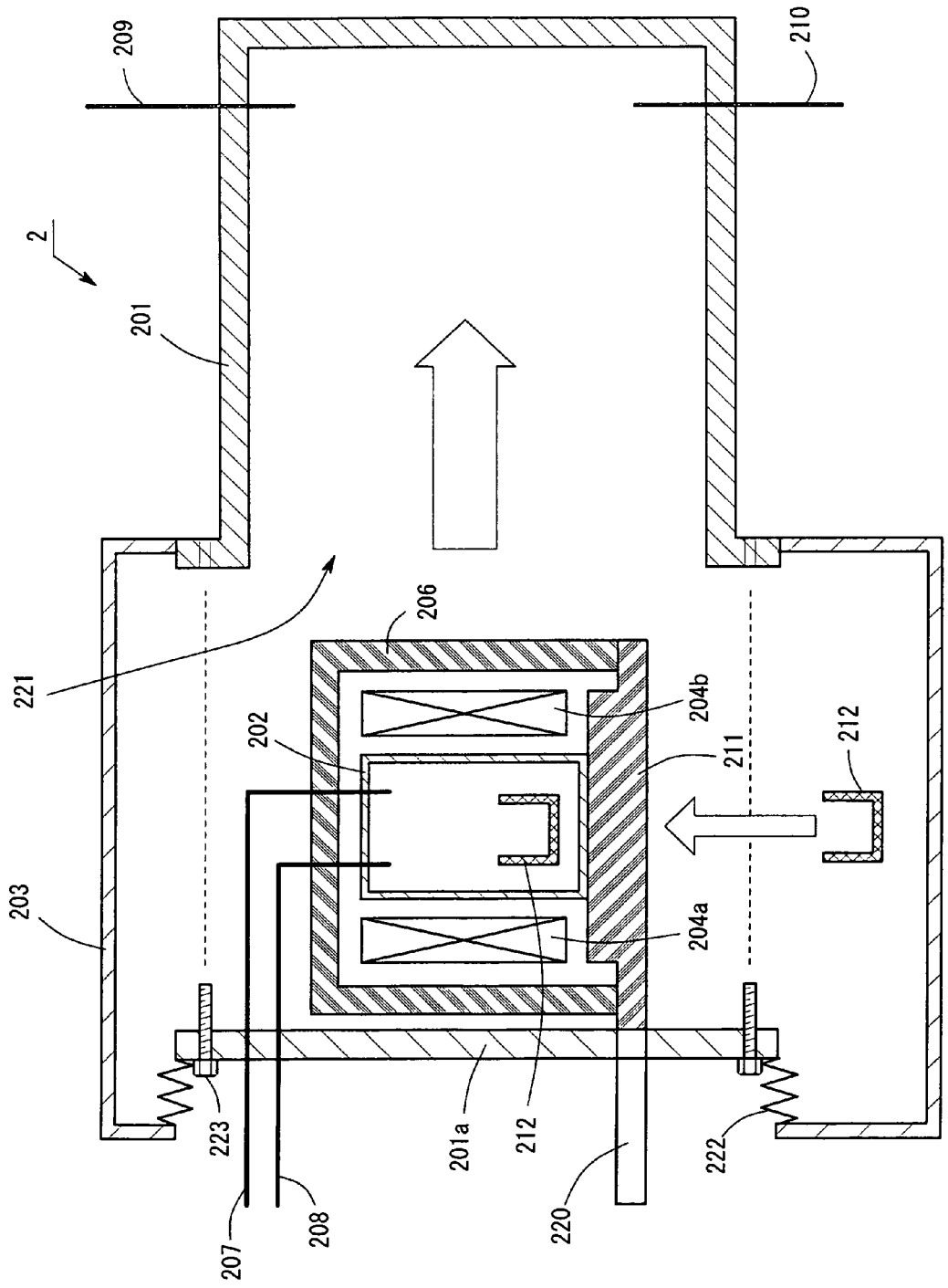
FIG. 5 is a sectional view showing the configuration of a Group-III-nitride-semiconductor manufacturing apparatus according to Embodiment 2 of the present invention.

FIG. 5 schematically shows the configuration of a Group-III-nitride-semiconductor manufacturing apparatus 2 according to Embodiment 2 of the present invention. The configuration of the apparatus 2 is described below.

The Group-III-nitride-semiconductor manufacturing apparatus 2 includes a horizontal pressure vessel 201; a reaction vessel 202 to be disposed within the pressure vessel 201; heating devices 204a and 204b for heating the reaction vessel 202 to be disposed within the pressure vessel 201; and a glove box 203 filled with argon gas.

A flanged lid 201a can open and close an opening portion 221 of the pressure vessel 201. The pressure vessel 201 and the glove box 203 are connected horizontally to each other such that the opening portion 221 of the pressure vessel 201 is exposed to the interior of the glove box 203. The flanged lid 201a and the glove box 203 are connected to each other via bellows 222. A moving device 220 is connected to the flanged lid 201a on a side toward the exterior of the glove box 203. The moving device 220 moves the flanged lid 201a while expanding or contracting the bellows 222 accordingly, and the opening portion 221 is opened and closed by loosening and tightening bolts 223 of the flanged lid 201a. By virtue of this configuration, when the pressure vessel 201 is opened, the glove box 203 and the pressure vessel 201 can have the same internal atmosphere; and, when the pressure vessel 201 is closed, the glove box 203 and the pressure vessel 201 can have different internal atmospheres.

A tray 211 on which the reaction vessel 202 is disposed is connected to the flanged lid 201a on a side toward the interior of the glove box 203. The tray 211 is formed from a thermal insulator. The heating devices 204a and 204b and the reaction vessel 202 disposed on the tray 211 are enclosed by a thermal insulator 206. Thus, when the pressure vessel 201 is closed by means of the moving device 220 moving the flanged lid 201a, the reaction vessel 202 and the heating devices 204a and 204b, which are enclosed by the thermal insulator 206, are disposed within the pressure vessel 201.

Connected to the reaction vessel 202 are a supply pipe 207 for supplying nitrogen into the reaction vessel 202, and an exhaust pipe 208 for exhausting the reaction vessel 202. Similarly, connected to the pressure vessel 201 are a supply pipe 209 and an exhaust pipe 210 for exhausting the pressure vessel 201. The flanged lid 201a and the reaction vessel 202 are connected to each other via the supply pipe 207 and the exhaust pipe 208. The supply pipe 207 is connected to an unillustrated source cylinder. When the flanged lid 201a is moved, the supply pipe 207 and the source cylinder are moved in association with the movement of the flanged lid 201a.

Similar to Embodiment 1, the Group-III-nitride-semiconductor manufacturing apparatus 2 assumes a structure in which the reaction vessel 202 is disposed within the pressure vessel 201, thereby eliminating need for the reaction vessel 202 to have high withstand pressure. Since the reaction vessel 202 and the heating devices 204a and 204b are enclosed by the thermal insulator 206, the pressure vessel 201 does not need to have high thermal-resistance.

Next will be described a process for manufacturing GaN by the Group-III-nitride-semiconductor manufacturing apparatus 2, and the operation of the Group-III-nitride-semiconductor manufacturing apparatus 2.

First, in the glove box 203, weighing is carried out to prepare Ga, Na serving as a flux material, and a seed crystal in respectively predetermined amounts, and the thus-prepared substances are placed in the crucible 212. The crucible 212 is placed in the reaction vessel 202, and then the reaction vessel 202 is placed on the tray 211. At this time, the pressure vessel 201 is opened, and the pressure vessel 201 and the glove box 203 are filled with argon gas and thus have the same internal atmosphere. The reaction vessel 202 and the heating devices 204a and 204b are then enclosed by the thermal insulator 206. Subsequently, the moving device 220 moves the reaction vessel 202 and the heating devices 204a and 204b, which are enclosed by the thermal insulator 206, into the pressure vessel 201. The bolts 223 of the flanged lid 201a are tightened, thereby closing the opening portion 221 of the pressure vessel 201.

Next, the pressure vessel 201 is evacuated to a vacuum. Then, nitrogen is supplied into the reaction vessel 202 and the pressure vessel 201 through the supply pipes 207 and 209, respectively, thereby pressurizing the reaction vessel 202 and the pressure vessel 201. Next, the reaction vessel 202 is heated, by the heating devices 204a and 204b, to a temperature at which a GaN crystal grows, thereby initiating crystal growth.

After completion of crystal growth, the crucible 212 is transferred into the glove box 203 through the reverse procedure of the above-mentioned procedure.

Similar to the Group-III-nitride-semiconductor manufacturing apparatus 1, in the Group-III-nitride-semiconductor manufacturing apparatus 2, the crucible 212 can be placed in the reaction vessel 202 disposed in the pressure vessel 201, without involvement of oxidation of Na or a like problem. Therefore, the reaction vessel 202 can be of a large-sized reusable type, and thus a large-sized Group III nitride semiconductor of high quality can be manufactured with low cost.

According to Embodiment 2, the moving device 220 moves the reaction vessel 202 and the heating devices 204a and 204b together with the flanged lid 201a while expanding or contracting the bellows 222. Alternatively, the present embodiment may be configured in such a manner that the flanged lid 201a is fixed, and the moving device 220 moves the pressure vessel 201 and the glove box 203 together so as to dispose the reaction vessel 202 and the heating devices 204a and 204b within the pressure vessel 201. Alternatively, the present embodiment may be configured in such a manner that the pressure vessel 201 is connected to the glove box 203 with bellows and the flanged lid 201a is fixed, and the moving device 220 moves the pressure vessel 201 so as to dispose the reaction vessel 202 and the heating devices 204a and 204b within the pressure vessel 201.

Embodiment 3

Figure 6:
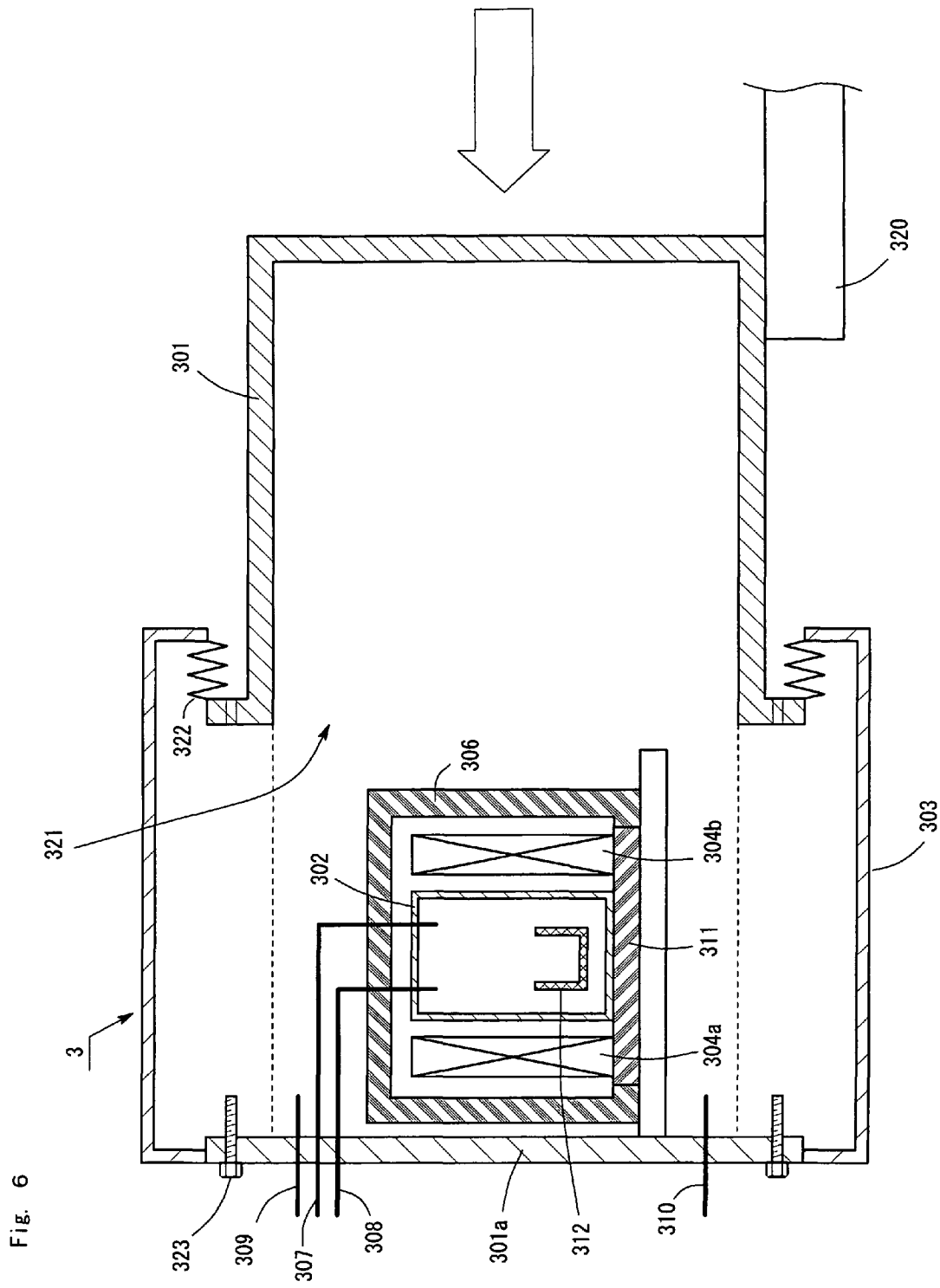
FIG. 6 is a sectional view showing the configuration of a Group-III-nitride-semiconductor manufacturing apparatus according to Embodiment 3 of the present invention.

FIG. 6 schematically shows the configuration of a Group-III-nitride-semiconductor manufacturing apparatus 3 according to Embodiment 3 of the present invention. The configuration of the apparatus 3 is described below.

The Group-III-nitride-semiconductor manufacturing apparatus 3 includes a horizontal pressure vessel 301; a reaction vessel 302 to be disposed within the pressure vessel 301; heating devices 304a and 304b for heating the reaction vessel 302 to be disposed within the pressure vessel 301; and a glove box 303 filled with argon gas.

A flanged lid 301a can open and close an opening portion 321 of the pressure vessel 301. Similar to Embodiment 2, the pressure vessel 301 and the glove box 303 are connected horizontally to each other such that the opening portion 321 of the pressure vessel 301 is exposed to the interior of the glove box 303. However, the pressure vessel 301 and the glove box 303 are connected to each other via bellows 322. By moving the pressure vessel 301 toward and away from the flanged lid 301a, the pressure vessel 301 can be closed and opened. The opening portion 321 of the pressure vessel 301 is opened and closed by loosening and tightening bolts 323 of the flanged lid 301a. The flanged lid 301a is fixedly connected to the glove box 303.

The reaction vessel 302 is disposed on a tray 311 connected to the flanged lid 301a. The heating devices 304a and 304b are disposed laterally of the reaction vessel 302. The reaction vessel 302 and the heating devices 304a and 304b are enclosed by a thermal insulator 306. Connected to the reaction vessel 302 are a supply pipe 307 for supplying nitrogen into the reaction vessel 302, and an exhaust pipe 308 for exhausting the reaction vessel 302. Similarly, connected to the flanged lid 301a are a supply pipe 309 for supplying nitrogen into the pressure vessel 301, and an exhaust pipe 310 for exhausting the pressure vessel 301. The flanged lid 301a and the reaction vessel 302 are connected to each other via the supply pipe 307 and the exhaust pipe 308.

The pressure vessel 301 is connected to a moving device 320. By means of the moving device 320 moving the pressure vessel 301 toward the flanged lid 301a, the pressure vessel 301 can be closed, whereby the reaction vessel 302 and the heating devices 304a and 304b reside within the pressure vessel 301.

Similar to Embodiment 2, in the Group-III-nitride-semiconductor manufacturing apparatus 3, a crucible 312 can be placed in the reaction vessel 302 disposed in the pressure vessel 301, without involvement of oxidation of Na or a like problem. Therefore, the reaction vessel 302 can be of a large-sized reusable type, and thus a large-sized Group III nitride semiconductor of high quality can be manufactured with low cost.

In Embodiments 2 and 3, the pressure vessel is connected horizontally to the glove box. However, a vertical pressure vessel may be connected vertically to a glove box.

Alternatively, the present embodiment may be configured in such a manner that the pressure vessel 301 is fixed and the moving device moves the flanged lid 301a with the glove box 303 together so as to dispose the reaction vessel 302 and the heating devices 304a and 304b within the pressure vessel 301.

Embodiment 4

Figure 7:
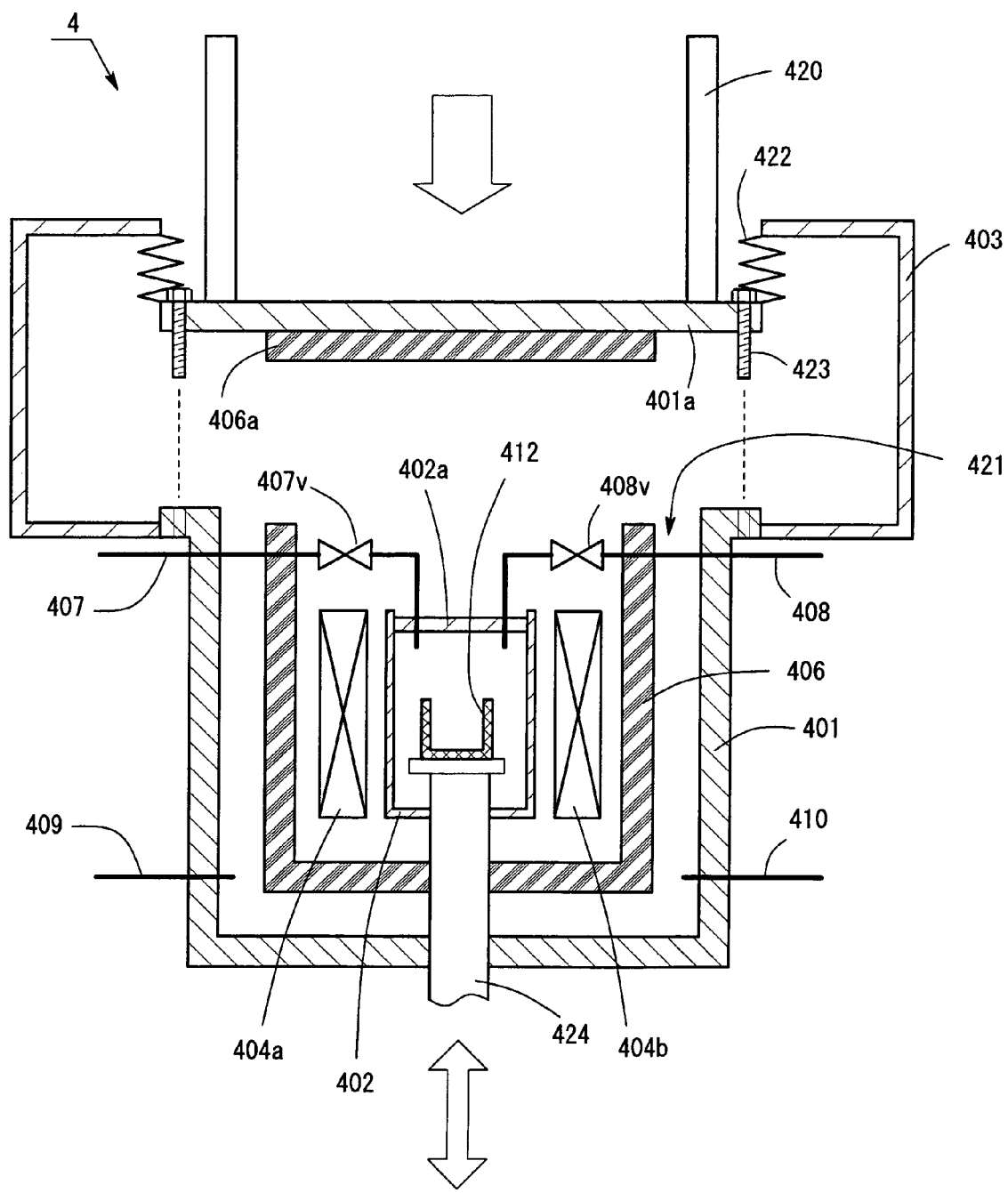
FIG. 7 is a sectional view showing the configuration of a Group-III-nitride-semiconductor manufacturing apparatus according to Embodiment 4 of the present invention.

FIG. 7 schematically shows the configuration of a Group-III-nitride-semiconductor manufacturing apparatus 4 according to Embodiment 4 of the present invention. The configuration of the apparatus 4 is described below.

The Group-III-nitride-semiconductor manufacturing apparatus 4 includes a vertical pressure vessel 401; a reaction vessel 402 disposed within the pressure vessel 401; heating devices 404a and 404b for heating the reaction vessel 402 disposed within the pressure vessel 401; and a glove box 403 filled with argon gas.

The pressure vessel 401 is connected vertically to a lower portion of the glove box 403 such that an opening portion 421 of the pressure vessel 401 is exposed to the interior of the glove box 403. A flanged lid 401a and the glove box 403 are connected to each other via bellows 422. A moving device 420 is connected to the flanged lid 401a on a side toward the exterior of the glove box 403. The moving device 420 moves the flanged lid 401a vertically while expanding or contracting the bellows 422, and the opening portion 421 of the pressure vessel 401 is opened and closed by loosening and tightening bolts 423 of the flanged lid 401a.

The reaction vessel 402 and the heating devices 404a and 404b are disposed within the pressure vessel 401 and are enclosed laterally and from underneath by a thermal insulator 406. When the opening portion 421 is closed by the flanged lid 401a, an opening of the insulator 406 located above the reaction vessel 402 and the heating devices 404a and 404b is closed by a thermal-insulator lid 406a which is connected to the flanged lid 401a on a side toward the interior of the glove box 403.

Connected to a lid 402a of the reaction vessel 402 are a supply pipe 407 for supplying nitrogen into the reaction vessel 402, and an exhaust pipe 408 for exhausting the reaction vessel 402. Similarly, connected to the pressure vessel 401 are a supply pipe 409 for supplying nitrogen into the pressure vessel 401, and an exhaust pipe 410 for exhausting the pressure vessel 401. Valves 407v and 408v are provided on the supply pipe 407 and the exhaust pipe 408, respectively. A lid of the reaction vessel 402 can be removed by disconnecting the supply pipe 407 and the exhaust pipe 408 at the valves 407v and 408v, respectively.

An elevating device 424 is provided for raising and lowering a crucible 412 between the interior of the glove box 403 and the interior of the reaction vessel 402. After the crucible 412 is placed on the raised elevating device 424, the elevating device 424 is lowered, whereby the crucible 412 can be transferred into the reaction container 402 from the interior of the glove box 403.

Next will be described a process for manufacturing GaN by the Group-III-nitride-semiconductor manufacturing apparatus 4, and the operation of the Group-III-nitride-semiconductor manufacturing apparatus 4.

First, the flanged lid 401a is raised by the moving device 420, thereby opening the pressure vessel 401; and the glove box 403 and the pressure vessel 401 are filled with argon gas so as to assume the same internal atmosphere. Further, the lid 402a of the reaction vessel 402 is removed; and the elevating device 424 on which the crucible 412 is to be placed is raised. Then, in the glove box 403, weighing is carried out to prepare Ga, Na serving as a flux material, and a seed crystal in respectively predetermined amounts, and the thus-prepared substances are placed in the crucible 412. The crucible 412 is placed on the elevating device 424. The elevating device 424 is lowered, thereby transferring the crucible 412 into the reaction vessel 402. Next, the reaction vessel 402 is closed by means of the lid 402a. The supply pipe 407 and the exhaust pipe 408 are connected to the reaction vessel 402 by means of the valves 407v and 408v, respectively. Subsequently, the flanged lid 401a is lowered by the moving device 420. The bolts 423 of the flanged lid 401a are tightened so as to close the pressure vessel 401. At this time, an opening of the insulator 406 located above the reaction vessel 402 and the heating devices 404a and 404b is closed by the thermal-insulator lid 406a connected to the flanged lid 401a.

Next, the pressure vessel 401 is evacuated to a vacuum. Then, nitrogen is supplied into the reaction vessel 402 and the pressure vessel 401 through the supply pipes 407 and 409, respectively, thereby pressurizing the reaction vessel 402 and the pressure vessel 401. Next, the reaction vessel 402 is heated, by the heating devices 404a and 404b, to a temperature at which a GaN crystal grows, thereby initiating crystal growth.

After completion of crystal growth, the crucible 412 is transferred into the glove box 403 through the reverse procedure of the above-mentioned procedure.

As described above, in the Group-III-nitride-semiconductor manufacturing apparatus 4 as well, the crucible 412 can be placed in the reaction vessel 402 disposed in the pressure vessel 401, without involvement of oxidation of Na or a like problem. Therefore, the reaction vessel 402 can be of a large-sized reusable type, and thus a large-sized Group III nitride semiconductor of high quality can be manufactured with low cost. According to the configuration of the Group-III-nitride-semiconductor manufacturing apparatus 4, only the flanged lid 401a is moved. Since the flanged lid 401a is light, the flanged lid 401a can be readily moved. Since the supply pipes 407 and 409 and the exhaust pipes 408 and 410 are fixed, an opening-closing mechanism can assume a simple configuration.

In Embodiment 4, the thermal-insulator lid 406a is connected to the flanged lid 401a; thus, opening and closing the pressure vessel 401 by means of the flanged lid 401a is accompanied by opening and closing of the thermal insulator 406. However, the following alternative configuration may be employed: the thermal-insulator lid is not connected to the flanged lid, and the thermal insulator is manually opened and closed by means of the thermal-insulator lid.

In Embodiments 2 to 4, in order to open and close the pressure vessel, the flanged lid and the body of the pressure vessel are engaged with and disengaged from each other by tightening and loosening the bolts. However, the present invention is not limited to such an opening-closing structure that uses bolts. The opening-closing structure may not use bolts for opening and closing the pressure vessel. For example, the opening-closing structure may be such that, after the opening portion of the pressure vessel and the flanged lid are fitted to each other, the flanged lid is turned to close the pressure vessel.

Embodiments 1 to 4 show a method of manufacturing GaN by use of Na as flux. Needless to say, the apparatus for manufacturing a Group III nitride semiconductor of the present invention can be used to manufacture a Group III nitride semiconductor other than GaN. In place of Na, potassium (K) or the like can be used as flux. Also, an alkaline-earth metal, such as calcium, or lithium, for example, may be added to the flux.

What is claimed is:

1. An apparatus for manufacturing a Group III nitride semiconductor, said apparatus comprising:
   a reaction vessel which holds, in a molten state, a Group III metal and a metal different from the Group III metal and serving as a flux;
   a heating device for heating the reaction vessel;
   a pressure vessel which contains the reaction vessel and the heating device;
   a fixed glove box connected to the pressure vessel that is fixed, the fixed glove box being filled with a gas which does not react with the flux;
   a flanged lid which closes or opens an opening-closing portion of the pressure vessel;
   a moving device which moves the flanged lid toward and away from the opening-closing portion of the pressure vessel, thereby the opening-closing portion of the pressure vessel is closed or opened; and
   a bellows which connects the flanged lid and the glove box, and seals the glove box and the pressure vessel from an external atmosphere including when the flanged lid is moved,
   wherein the reaction vessel and the heating device are disposed within the pressure vessel,
   wherein a space between the opening-closing portion of the pressure vessel and the flanged lid is located inside of the glove box when the flanged lid is moved away from the opening-closing portion of the pressure vessel, and the opening-closing portion is opened, and
   wherein the opening-closing portion of the pressure vessel and the flanged lid are fixed when the opening-closing portion of the pressure vessel is closed by the flanged lid.

2. An apparatus for manufacturing a Group III nitride semiconductor, said apparatus comprising:
- a reaction vessel which holds, in a molten state, a Group III metal and a metal different from the Group III metal and serving as flux;
- a heating device for heating the reaction vessel;
- a pressure vessel which contains the reaction vessel and the heating device during a crystal growth, and is movable disposed;
- a fixed glove box connected to the pressure vessel, and filled with a gas which does not react with the flux;
- a flanged lid which closes or opens an opening-closing portion of the pressure vessel, and is fixed to the glove box;
- a moving device which moves the pressure vessel toward and away from the flanged lid, thereby the opening-closing portion of the pressure vessel is closed or opened; and
- a bellows which connects the pressure vessel and the glove box, and seals the love box and the pressure vessel from an external atmosphere including when the pressure vessel is moved,
- wherein a space between the opening-closing portion of the pressure vessel and the flanged lid is located inside of the glove box when the pressure vessel is moved away from the flanged lid, and the opening-closing portion is opened,
- wherein the reaction vessel and the heating device are provided on a side of the flanged lid, said side being located toward the pressure vessel, and
- wherein the opening-closing portion of the pressure vessel and the flanged lid are fixed when the opening-closing portion of the pressure vessel is closed by the flanged lid.

3. The apparatus for manufacturing a Group III nitride semiconductor according to claim 2, wherein the pressure vessel is connected horizontally to the glove box.

4. The apparatus for manufacturing a Group III nitride semiconductor according to claim 2, wherein the pressure vessel is connected vertically to the glove box.

5. The apparatus for manufacturing a Group III nitride semiconductor according to claim 1, wherein the reaction vessel and the heating device are enclosed by a thermal insulator.

6. The apparatus for manufacturing a Group III nitride semiconductor according to claim 1, wherein the Group III metal comprises gallium, and the metal different from the Group III metal comprises sodium.

7. The apparatus for manufacturing a Group III nitride semiconductor according to claim 1, wherein the pressure vessel is connected horizontally to the glove box.

8. The apparatus for manufacturing a Group III nitride semiconductor according to claim 1, wherein the pressure vessel is connected vertically to the glove box.

9. The apparatus for manufacturing a Group III nitride semiconductor according to claim 2, wherein the reaction vessel and the heating device are enclosed by a thermal insulator.

10. An apparatus for manufacturing a Group III nitride semiconductor, said apparatus comprising:
- a reaction vessel which holds, in a molten state, a Group III metal and a metal different from the Group III metal and serving as flux;
- a heating device for heating the reaction vessel;
- a fixed pressure vessel which contains the reaction vessel and the heating device during crystal growth;
- a fixed glove box connected to the pressure vessel, and filled with a gas which does not react with the flux;
- a flanged lid which closes or opens an opening-closing portion of the pressure vessel;
- a moving device which moves the flanged lid toward and away from the opening-closing portion of the pressure vessel, thereby the opening-closing portion of the pressure vessel is closed or opened; and
- a bellows which connects the flanged lid and the glove box, and seals the glove box and the pressure vessel from an external atmosphere including when the flanged lid is moved,
- wherein a space between the opening-closing portion of the pressure vessel and the flanged lid is located inside of the glove box when the flanged lid is moved away from the opening-closing portion of the pressure vessel, and the opening-closing portion of the pressure vessel is opened,
- wherein the reaction vessel and the heating device are provided on a side of the flanged lid, said side being located toward the pressure vessel, and the reaction vessel and the heating device move together with the flanged lid, and
- wherein the opening-closing portion of the pressure vessel and the flanged lid are fixed when the opening-closing portion of the pressure vessel is closed by the flanged lid.

11. An apparatus for manufacturing a Group III nitride semiconductor, said apparatus comprising:
- a reaction vessel which holds, in a molten state, a Group III metal and a metal different from the Group III metal and serving as flux;
- a heating device for heating the reaction vessel;
- a pressure vessel which contains the reaction vessel and the heating device during crystal growth;
- a glove box connected to the pressure vessel, and filled with a gas which does not react with the flux;
- a fixed flanged lid which closes or opens an opening-closing portion of the pressure vessel;
- a moving device which moves the pressure vessel and the glove box toward and away from the flanged lid, thereby the opening-closing portion of the pressure vessel is closed or opened;
- a bellows which connects the flanged lid and the glove box, and seals the glove box and the pressure vessel from an external atmosphere including when the pressure vessel and the glove box are moved,
- wherein a space between the opening-closing portion of the pressure vessel and the flanged lid is located inside of the glove box when the opening-closing portion of the pressure vessel is moved away from the flanged lid, and the opening-closing portion of the pressure vessel is opened,
- wherein the reaction vessel and the heating device are provided on a side of the flanged lid, said side being located toward the pressure vessel, and
- wherein the opening-closing portion of the pressure vessel and the flanged lid are fixed when the opening-closing portion of the pressure vessel is closed by the flanged lid.

12. The apparatus for manufacturing a Group III nitride semiconductor according to claim 1, wherein the glove box and the pressure vessel are fixed when the bellows moves the flange lid toward and away from the opening-closing portion of the pressure vessel.

13. The apparatus for manufacturing a Group III nitride semiconductor according to claim 2, wherein the flanged lid and the glove box are fixed as the pressure vessel is moved away from the flanged lid.

14. The apparatus for manufacturing a Group III nitride semiconductor according to claim 10, wherein the glove box and the pressure vessel are fixed when the flange lid is moved toward and away from the opening-closing portion of the pressure vessel.

15. The apparatus for manufacturing a Group III nitride semiconductor according to claim 11, wherein the flanged lid is fixed when the bellows moves the pressure vessel and the glove box away from the flanged lid.

16. The apparatus for manufacturing a Group III nitride semiconductor according to claim 10, wherein the pressure vessel is connected horizontally to the glove box.

17. The apparatus for manufacturing a Group III nitride semiconductor according to claim 11, wherein the pressure vessel is connected horizontally to the glove box.

18. The apparatus for manufacturing a Group III nitride semiconductor according to claim 10, wherein the pressure vessel is connected vertically to the glove box.

19. The apparatus for manufacturing a Group III nitride semiconductor according to claim 11, wherein the pressure vessel is connected vertically to the glove box.

* * * * *

UNITED STATES PATENT AND TRADEMARK OFFICE
CERTIFICATE OF CORRECTION

PATENT NO. : 8,349,079 B2
APPLICATION NO. : 12/153973
DATED : January 8, 2013
INVENTOR(S) : Shiro Yamazaki et al.

It is certified that error appears in the above-identified patent and that said Letters Patent is hereby corrected as shown below:

In column 11, line 8 (line 8 of claim 2), replace "movable" with "movably"

Signed and Sealed this
Second Day of April, 2013

Teresa Stanek Rea
*Acting Director of the United States Patent and Trademark Office*